United States Patent [19]

Voltmer et al.

[11] 4,140,570
[45] Feb. 20, 1979

[54] METHOD OF GROWING SINGLE CRYSTAL SILICON BY THE CZOCHRALSKI METHOD WHICH ELIMINATES THE NEED FOR POST GROWTH ANNEALING FOR RESISTIVITY STABILIZATION

[75] Inventors: Frederic W. Voltmer, Richardson, Tex.; Thomas G. Digges, Jr., Thousand Oaks, Calif.

[73] Assignee: Texas Instruments Incorporated, Dallas, Tex.

[21] Appl. No.: 417,437

[22] Filed: Nov. 19, 1973

[51] Int. Cl.² .................. B01J 17/18; C01B 33/02
[52] U.S. Cl. .................. 156/617 SP; 156/DIG. 64; 156/DIG. 73
[58] Field of Search .............. 23/301 SP, 273 SP; 156/DIG. 64, 617 SP, 600, 603, DIG. 73

[56] References Cited

U.S. PATENT DOCUMENTS

| | | | |
|---|---|---|---|
| 3,130,040 | 4/1964 | Faust, Jr. et al. | 23/301 SP |
| 3,173,765 | 3/1965 | Gobat et al. | 23/301 SP |
| 3,226,203 | 12/1965 | Rummel | 23/301 SP |
| 3,271,115 | 9/1966 | Keller | 23/301 SP |

*Primary Examiner*—Stephen J. Emery
*Attorney, Agent, or Firm*—James T. Comfort; Gary C. Honeycutt

[57] ABSTRACT

This disclosure relates to a technique of improving the quality of crystals grown by the Czochralski method by substantially eliminating the formation of electrically active oxygen complexes during growth. The oxygen which forms these complexes is liberated from the quartz liner which contains the silicon melt. It has been found that electrically active oxygen complexes (oxygen donors) are formed in the silicon lattice during crystal growth when the crystal is in the range of 300–500° C. Above and below this temperature range, the formation of oxygen donors in the silicon lattice is minimal. The crystal is therefore maintained in its entirety above the temperature of 500° C. and then is quenched to be quickly brought below the 300° C. level. In this way, the silicon crystal is in the 300° C. to 500° C. range for a minimal period of time, thereby minimizing the amount of oxygen donor formation in the silicon lattice during growth. The quenching can take place along the entire rod after it has been pulled, or it can take place on a zone basis along the rod after it is moved away from the melt.

10 Claims, 6 Drawing Figures

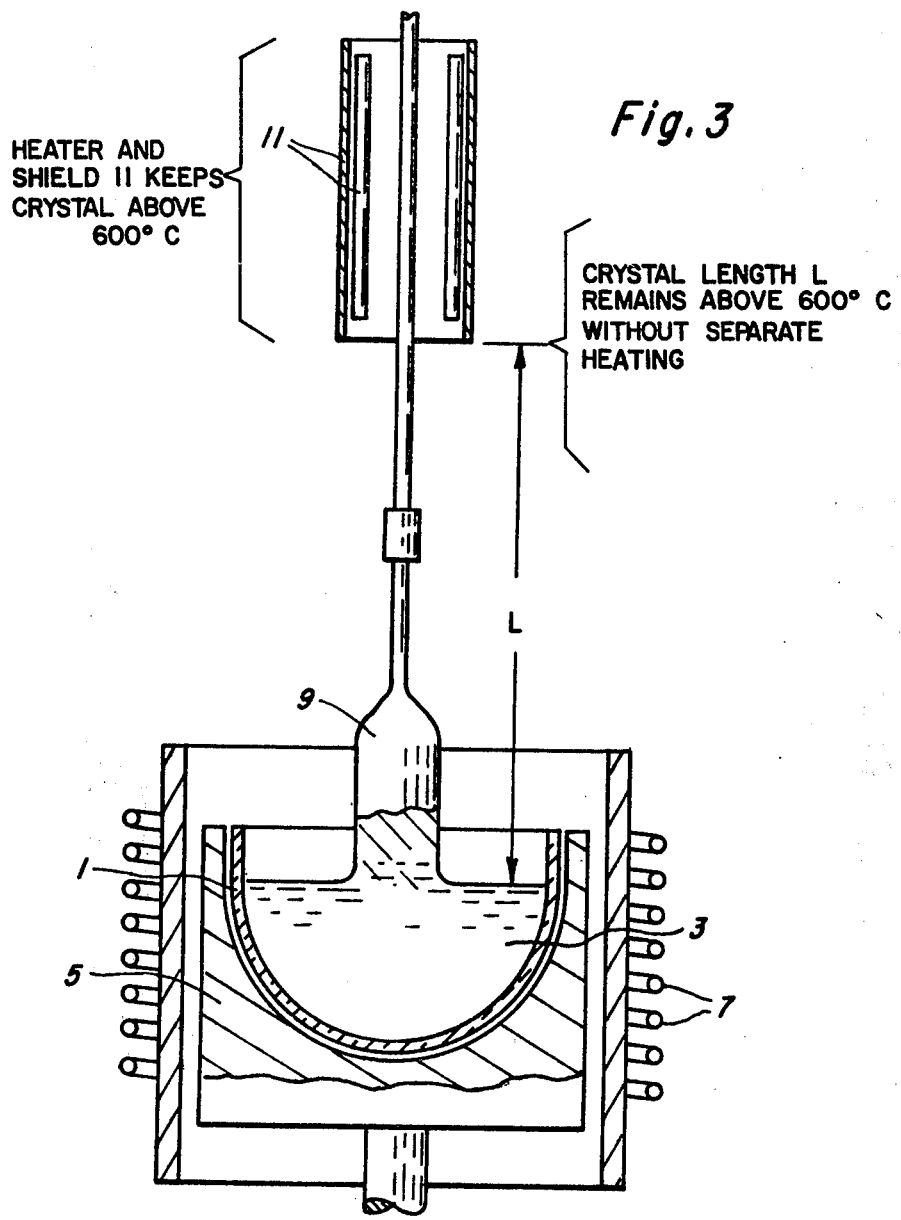

METHOD OF GROWING SINGLE CRYSTAL SILICON BY THE CZOCHRALSKI METHOD WHICH ELIMINATES THE NEED FOR POST GROWTH ANNEALING FOR RESISTIVITY STABILIZATION

This invention relates to the growth of improved quality single crystal silicon by the Czochralski method and, more specifically, to the growth of single crystal silicon wherein the formation of oxygen donors during growth is minimized and the resistivity of the crystal over its entire length is determined solely by intentionally introduced impurities.

In the growth of single crystal silicon by the Czochralski method, when the crystal decreases in temperature to the range of 300° C. to 500° C. and most strongly at about 450° C., oxygen which is liberated from the quartz liner or elsewhere becomes electrically active in the silicon lattice. Typical oxygen concentrations in Czochralski crystals are $10^{18}$ atoms per cubic centimeter. The number of oxygen donors generated is a function of time and temperature. In those regions of the crystal wherein the oxygen has been incorporated into the silicon lattice, the resistivity of the silicon crystal takes on erratic values, which, also, are not always within the normally desired resistivity ranges for semiconductor silicon crystals. The prior art has overcome this problem by annealing the crystals, subsequent to growth at greater than 600° C., thereby eliminating as many as $2 \times 10^{16}$ free electrons per square centimeter, owing to oxygen donors. This has brought the resistivity of the entire grown silicon rod into the desired resistivity range, however this requires the extra annealing steps.

In accordance with the present invention, the above noted extra annealing step is eliminated and single crystal silicon is grown by the Czochralski method wherein the entire rod has a resistivity within the desired resistivity range. Briefly, this is accomplished by heating or maintaining the entire grown rod at a temperature above 500° C. and preferably about 600° C. until the entire rod has been grown, whereupon the entire rod is then quickly quenched to a temperature below 300° C. Since the oxygen becomes electrically active and incorporates into the silicon lattice substantially only in a temperature range of 300° C. to 500° C., there is minimal electrically active oxygen incorporated into the silicon lattice, and therefore the resistivity of the grown rod is within the desired resistivity range. Alternatively, the rod can be maintained at a temperature above 500° C. and then sequentially quenched in zones therealong so that, again, no part of the silicon crystal is within the range of 300° C. to 500° C. for an extended period of time.

It is therefore an object of this invention to provide a method for the growth of single crystal silicon by the Czochralski method with a controlled resistivity and without the need of post growth heat treatment to achieve resistivity stability.

It is a further object of this invention to provide a method of growth of single crystal silicon by the Czochralski method which substantially prevents the incorporation of electrically active oxygen into the silicon lattice during crystal growth.

It is yet a further object of this invention to provide a method for the growth of single crystal silicon by the Czochralski method in a single step. It is a still further object of this invention to provide a method for the growth of single crystal silicon with a substantially normal resistivity profile over the entire crystal.

The above objects and still further objects of the invention will immediately become apparent to those skilled in the art after consideration of the following preferred embodiment thereof, which is provided by way of example and not by way of limitation, wherein:

FIG. 3 is a schematic diagram of a system for growing single crystal silicon by the Czochralski method in accordance with the present invention;

FIG. 6 is a labeled rectangular block representing the step of quenching the pulled crystal.

Figure 1:
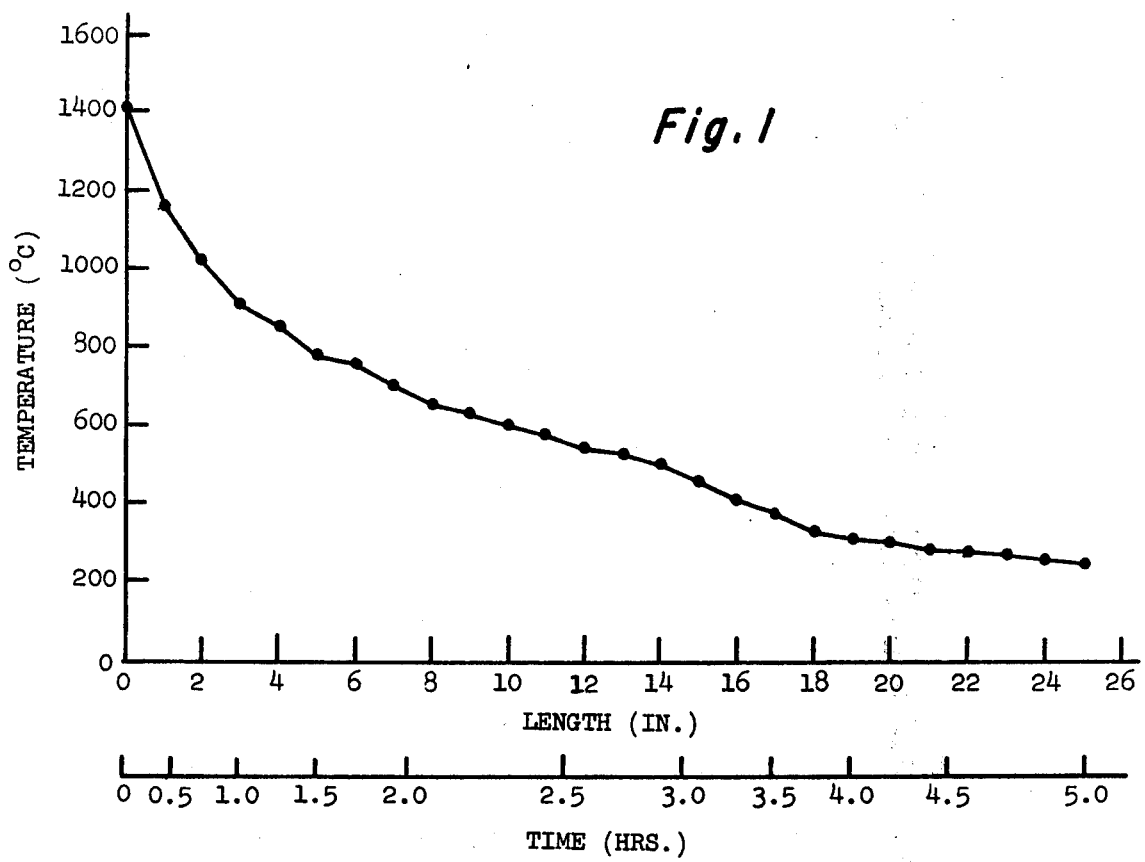
FIG. 1 is a graph of temperature in ° C. vs. distance of a point on a single crystal silicon rod from the melt and time of travel of that point from the melt in a system of single crystal silicon growth by the Czochralski method.
Figure 2:
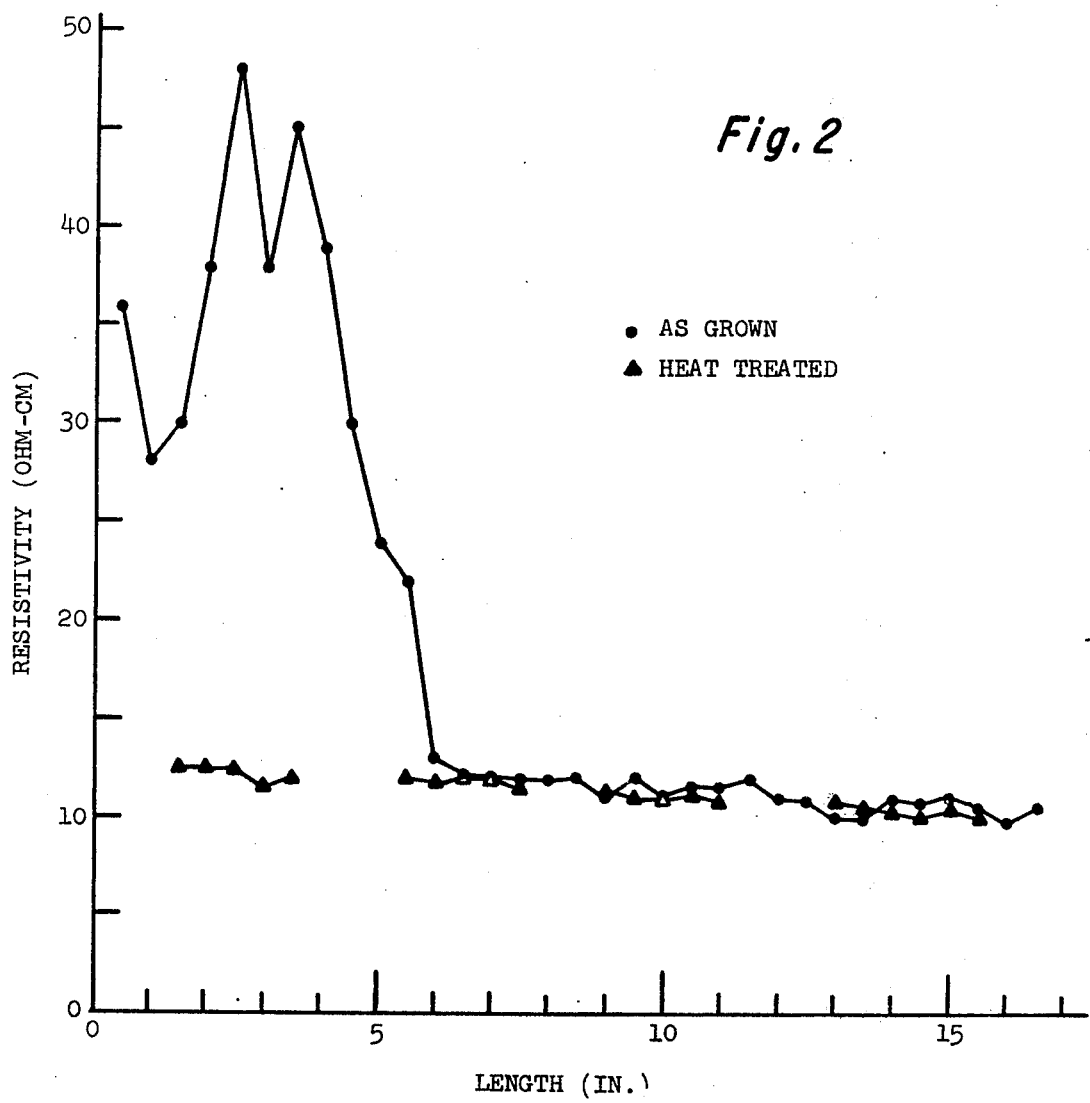
FIG. 2 is a graph of resistivity of points on a crystal rod formed by the Czochralski method prior to annealing (dots) and subsequent to annealing (triangles) when using the standard prior art system.

Referring now to FIG. 1, there is shown the temperature of the grown silicon rod as a function of its length in inches from the melt and the elapsed time in hours. It can be seen that, in the growth of a 24 inch rod, as shown in FIG. 1, the rod temperature enters into the range of 300° to 500° C. At most points after about a 14 inch distance from the melt, as stated hereinabove, that region of the rod which is maintained at a temperature in the range of 300° to 500° C. for any appreciable length of time has the oxygen transformed to electrically active donor complexes. This is confirmed with reference to FIG. 2, wherein a plot of the resistivity of the rod in ohm-centimeters is provided as a function of the length in inches. As shown with dots, the resistivity takes on erratic values for a substantial portion of the rod, the profiles of FIGS. 1 and 2 relating to an as-grown, p-type, boron-doped crystal pulled under normal conditions. As shown in FIG. 2 by the triangles, the resistivity curve of the same crystal rod after an appropriate annealing to eliminate the oxygen donors was flattened out. However, the annealing step was required to perform this function.

With reference to FIG. 3, there is shown a system for carrying out the method of the present invention, this including the conventional apparatus used in the Czochralski method of silicon growth as well as a heater and a shield, the function of which will now be explained. The system includes a quartz liner 1 having a silicon melt 3 therein, the quartz liner being positioned in a graphite suscepter 5 around which are positioned RF coils 7 which provide the energy to liquify the silicon melt 3 in a well-known manner. A crystal 9 is pulled from the melt 3 in a well-known manner. As noted in FIG. 1, as the crystal is pulled from the melt, the temperature thereof will gradually decrease to approach the region of 300° to 500° C. Therefore, as the crystal is pulled to the point where the temperature will start to approach 600° C. from the upper direction, a heater and shield 11 is provided to maintain the temperature of the crystal above about 600° C. and definitely above the 500° C. temperature to prevent the formation of oxygen donoring the silicon lattice. When the entire crystal has been pulled, helium, argon, neon or other inert gas is flowed around the entire crystal to quickly bring the temperature thereof below 300° C., as indicated by FIG. 6. Therefore, the crystal is in the 300° C. to 500° C. range for a minimal period and the formation of oxygen donors the silicon lattice is minimized.

Figure 4:
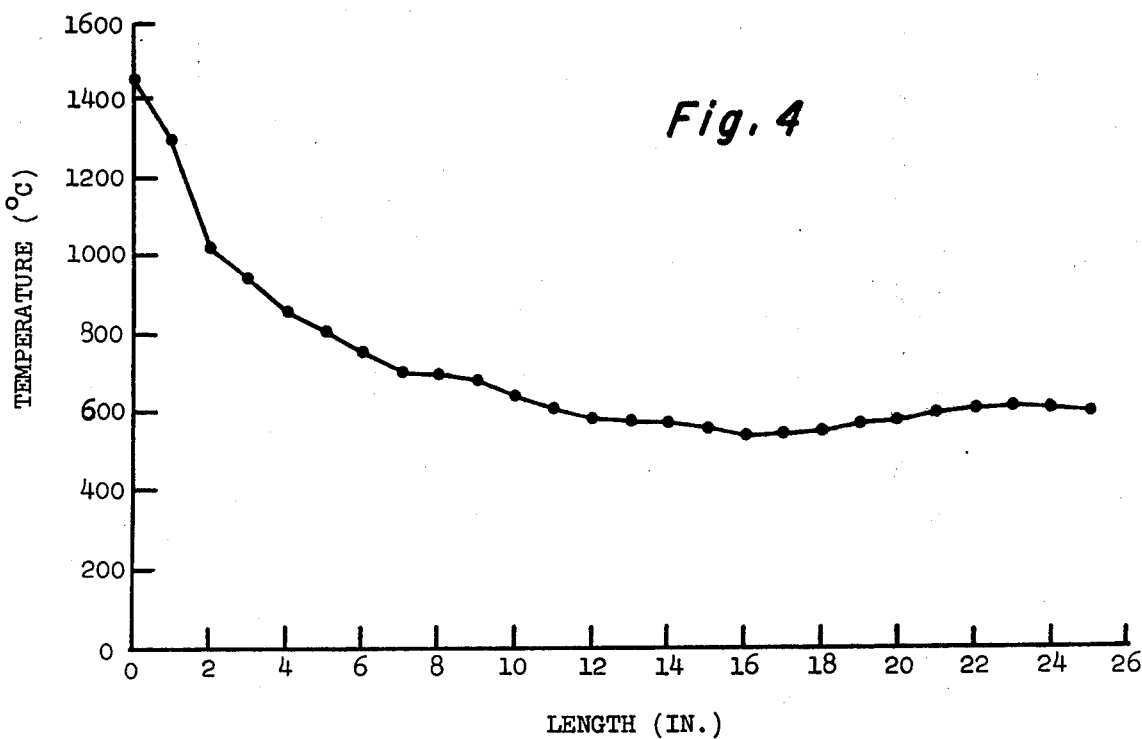
FIG. 4 is a graph of temperature in ° C. vs. crystal distance from the melt in inches for a crystal pulled using the apparatus of FIG. 3.

Referring to FIG. 4, there is shown a graph of the temperature in degrees centigrade with respect to the length in inches of a crystal pulled in accordance with the apparatus shown in FIG. 3. It can be seen that the temperature decreased to about 600° C. and then was maintained in that region for the entire length of the crystal.

Figure 5:
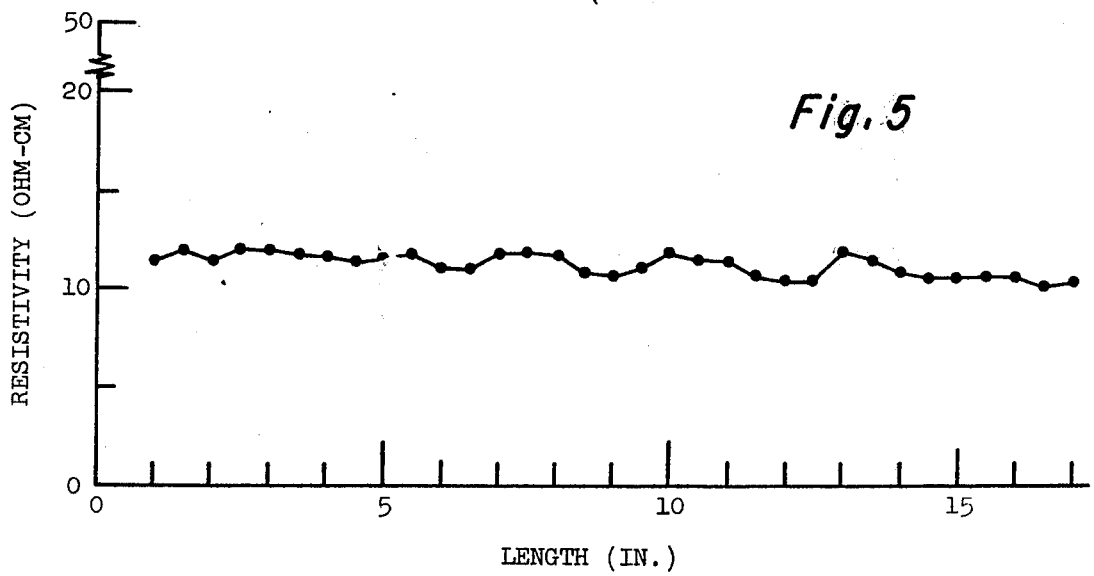
FIG. 5 is a graph of resistivity in ohm-centimeters vs. distance of points from the melt of a crystal pulled by the apparatus of FIG. 3.

Reference to FIG. 5, which is a plot of the resistivity in ohm-centimeters with respect to the length in inches of the rods grown in accordance with the apparatus of FIG. 3, shows that the resistivity of the entire rod was maintained substantially constant and within the desired range of 10 to 20 ohm centimeters which was being attempted without annealing.

It should be understood that the main purpose of the apparatus described in FIG. 3 is to maintain the entire crystal at a temperature above about 500° C. and preferably 600° C. so that the oxygen liberated from the quartz liner or elsewhere does not incorporate into the silicon lattice in such a manner as to form electrically active complexes during crystal growth. It is then necessary that the entire crystal be quenched below 300° C. as rapidly as possible to prevent oxygen donor formation. This can be done in the manner described by applying helium or other inert quenching gas along the entire length of the rod or by quenching the rod selectively along zones, each zone progressively closer to the melt, or any other manner which will perform the above noted procedures.

It can be seen that there has been described a method of forming single crystal silicon by the Czochralski method wherein oxygen donor formation in the silicon lattice during growth is substantially eliminated, thereby eliminating the requirement for post-growth heat treatment or annealing to achieve resistivity stability.

Though the invention has been described with respect to a specific preferred embodiment thereof, many variations and modifications thereof will immediately become apparent to those skilled in the art. It is therefore the intention that the appended claims be interpreted as broadly as possible in view of the prior art to include all such variations and modifications.

What is claimed is:

1. A method of growing single crystal silicon which includes the steps of:
    (a) pulling a single crystal silicon rod from a silicon melt,
    (b) maintaining the temperature of said entire rod above 500° C., and
    (c) rapidly cooling said rod from above about 500° C. to below about 300° C. to prevent formation of oxygen donors in the silicon lattice.

2. A method as set forth in claim 1, wherein said temperature in step (b) is maintained above about 600° C.

3. A method as set forth in claim 1 wherein said cooling is provided by the step of flowing an inert gas around said rod.

4. A method as set forth in claim 3 wherein said inert gas is taken from the class consisting of neon, argon and helium.

5. A method as set forth in claim 2 wherein said cooling is provided by the step of flowing an inert gas around said rod.

6. A method as set forth in claim 5 wherein said inert gas is taken from the class consisting of neon, argon and helium.

7. A method as set forth in claim 1 wherein said cooling is provided by the step of flowing an inert gas around selected region of the rod, each region progressively closer to the melt.

8. A method as set forth in claim 7 wherein said inert gas is taken from the class consisting of neon, argon and helium.

9. A method as set forth in claim 2 wherein said cooling is provided by the step of flowing an inert gas around selected region of the rod, each region progressively closer to the melt.

10. A method as set forth in claim 9 wherein said inert gas is taken from the class consisting of neon, argon and helium.

* * * * *